United States Patent
Poon et al.

(10) Patent No.: US 6,897,118 B1
(45) Date of Patent: May 24, 2005

(54) METHOD OF MULTIPLE PULSE LASER ANNEALING TO ACTIVATE ULTRA-SHALLOW JUNCTIONS

(75) Inventors: Chyiu-Hyia Poon, Singapore (SG); Byung Jin Cho, Singapore (SG); Yong Feng Lu, Lincoln, NE (US); Alex See, Singapore (SG); Mousumi Bhat, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/776,794

(22) Filed: Feb. 11, 2004

(51) Int. Cl.$^7$ .................. H01L 21/336; H01L 21/20; H01L 21/36; H01L 21/265
(52) U.S. Cl. .................. 438/303; 438/482; 438/484; 438/520; 438/522
(58) Field of Search .................. 438/303, 482, 438/484, 520, 522, 528

(56) References Cited

U.S. PATENT DOCUMENTS

| | | | | |
|---|---|---|---|---|
| 5,953,615 A | * | 9/1999 | Yu | 438/303 |
| 5,956,603 A | * | 9/1999 | Talwar et al. | 438/520 |
| 5,966,605 A | | 10/1999 | Ishida | 438/299 |
| 6,319,761 B1 | | 11/2001 | Zhang et al. | 438/166 |
| 6,365,446 B1 | | 4/2002 | Chong et al. | 438/197 |
| 6,372,585 B1 | | 4/2002 | Yu | 438/301 |
| 6,391,731 B1 | | 5/2002 | Chong et al. | 438/303 |

* cited by examiner

Primary Examiner—Olik Chaudhurl
Assistant Examiner—William M. Brewster
(74) Attorney, Agent, or Firm—George O. Saile; Rosemary L. S. Pike

(57) ABSTRACT

A method for forming a highly activated ultra shallow ion implanted semiconductive elements for use in sub-tenth micron MOSFET technology is described. A key feature of the method is the ability to activate the implanted impurity to a highly active state without permitting the dopant to diffuse further to deepen the junction. A selected single crystalline silicon active region is first amorphized by implanting a heavy ion such as silicon or germanium. A semiconductive impurity for example boron is then implanted and activated by pulsed laser annealing whereby the pulse fluence, frequency, and duration are chosen to maintain the amorphized region just below it's melting temperature. It is found that just below the melting temperature there is sufficient local ion mobility to secure the dopant into active positions within the silicon matrix to achieve a high degree of activation with essentially no change in concentration profile. The selection of the proper laser annealing parameters is optimized by observation of the reduction of sheet resistance and concentration profile as measured on a test site. Application of the method is applied to forming a MOS FET and a CMOS device. The additional processing steps required by the invention are applied simultaneously to both n-channel and p-channel devices of the CMOS device pair.

38 Claims, 8 Drawing Sheets

METHOD OF MULTIPLE PULSE LASER ANNEALING TO ACTIVATE ULTRA-SHALLOW JUNCTIONS

BACKGROUND OF THE INVENTION (1) Field of the Invention

The invention relates to processes for the manufacture of semiconductor devices and more particularly to processes to the formation of MOSFETs (metal oxide silicon field effect transistors).

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. Most of the ICs produced today utilize the MOSFET as the basic semiconductive device. MOSFETs are chosen over their bipolar counterparts because they can be easily manufactured and, because they operate at low voltages and currents, they generate less heat thereby making them well suited for high density circuit designs.

The basic MOSFET (Metal Oxide Semiconductor Field Effect Transistor) is typically formed by a self-aligned polysilicon gate process wherein source and drain regions are formed adjacent to the polysilicon gate by ion implantation using the gate as a mask. The source/drain is thereby self-aligned to the gate electrode. A channel region directly under the polysilicon gate is thereby also defined by the gate electrode. In order to reduce hot electron injection into the channel region, a low concentration of source/drain dopant is first implanted with the gate as a mask. This is commonly referred to as a lightly doped drain (LDD) implant. Sidewalls are then formed alongside the gate electrode and a second substantially deeper and higher dosage implant is then applied to form the main source/drain regions which are spaced laterally away from the edge of the polysilicon gate by the sidewall thickness. The completed source/drain regions then each consist of a main heavily doped portion to which external contact is made and a lightly doped extended portion which abuts the channel region.

As device dimension continue to shrink, short channel effects become significant and begin to affect device performance. In conventional LDD processes short channel effects are compensated by implanting shallower junctions which come at the expense of high impurity concentrations. As a consequence, the resultant lower impurity concentrations cause undesirably high source and drain series resistance. It is therefore desirable to form shallow LDD regions with highly activated impurity concentrations and abrupt junctions.

Ishida, U.S. Pat. No. 5,966,605 cites a method for infusing dopant into a polysilicon gate structure by first blanket depositing a dopant enriched layer over the wafer after the polysilicon gate structure has been formed. Laser irradiation is then applied to melt the polysilicon and thereby causing the dopant to be infused therein. The laser energy is not sufficient to melt and cause dopant infusion into the source/drain regions. Yu, U.S. Pat. No. 6,372,585 B1 shows that nitrogen, implanted into silicon can be induced to bond within the silicon by pulsed laser annealing. Zhang, et.al., U.S. Pat. No. 6,319,761 B1 shows that annealing of ion implanted source/drain regions with an excimer laser improves crystallinity and repairs implant damage.

Chong, et.al. U.S. Pat. No. 6,365,446 B1, issued to the present assignee, shows a method for simultaneously forming silicide contact regions and source/drain regions by first, amorphizing the designated regions by ion implantation of Ge, As, or Ar, next depositing a refractory metal layer, and then implanting the dopant ions through a metal layer. The amorphized regions are then melted by laser irradiation, causing the dopant atoms to quickly distribute in the melted regions. At the same time, the refractory metal reacts with the upper surfaces of the molten amorphized silicon regions to form a metal silicide. The melted source/drain regions then recrystallize to form active source/drain elements.

In a related patent Chong, et.al. U.S. Pat. No. 6,391,731 B1, amorphize both the deep source/drain regions and the shallow source/drain extensions using two Ge, As, or Ar implantations. After dopant implantation, a single laser anneal then melts these regions and caused the dopant to distribute. After the anneal the regions re-crystallize epitaxially from the subjacent single crystalline silicon to form highly activated, very shallow doped regions with abrupt junctions.

It is found by the present inventors that, while a high degree of activation and superior abrupt junctions are obtained by these measures, junction movement nevertheless occurs during the laser annealing process, wherein the amorphous regions are selectively melted and then recrystallized. This becomes increasingly significant and measurable for ultra shallow source/drain extensions or LDD regions. This is illustrated in FIG. 1 wherein the boron profile is shown before 50 and after a spike rapid thermal anneal 52 and after a single laser melting anneal 54 at a laser energy of 0.4 Joules/cm$^2$ for a pulse duration of about 23 nanoseconds. Estimating the junction begins at a point where the boron concentration diminishes to about $2\times10^8$ atoms/cm$^3$, the as implanted junction is at a depth of about 35 nm. After the spike RTA at 1,080 C, the junction has moved to about 58 nm. After the laser anneal the junction depth has essentially doubled, dropping down to about 65 nm. The profile 54 after the single pulse laser anneal is typical and clearly shows the uniform boron distribution which occurs during period when the silicon is molten. The point 56 is believed to be the bottom boundary of the amorphous silicon which is molten during the laser anneal. The boron beyond this point has diffused out of the amorphous region and into the subjacent single crystal silicon during the molten period, resulting in a deeper junction, the junction profile is decidedly more abrupt than the as deposited boron. The sheet resistance recorded for the laser annealed profile shown in FIG. 1 was 215 ohms/square while that of the RTA spike anneal was about 300 ohms/square.

While single pulse laser anneal exhibits a higher degree of activation than the spike RTA anneal, as indicated by the lower resistivity, the increase of junction depth is not a welcome compromise. It is therefore desirable to achieve low resistivity without sacrificing junction depth. The present invention cites an activation annealing procedure which results in a high degree of activation while leaving the as-implanted dopant profile essentially unchanged.

SUMMARY OF THE INVENTION

It is an object of this invention to provide a method for activating an ion implanted dopant impurity without shifting the dopant concentration profile.

It is another object of this invention to provide a method for forming for forming highly activated, ultra shallow semiconductive element of a first conductive type embedded in a semiconductive region of a second conductive type.

It is yet another object of this invention to describe a method for forming a MOSFET device having ultra shallow lightly doped source/drain extensions.

These objects are accomplished by first defining an active silicon region on a silicon wafer, then defining source/drain regions in the active silicon region by forming a gate electrode over a gate oxide. The source/drain regions are then selectively amorphized by ion implantation followed by implantation of the desired dopant species into these regions. The dopant is next activated by pulsed laser annealing whereby the pulse fluence, frequency, and duration are chosen to maintain the amorphized region just below it's melting temperature. It is found that just below the melting temperature there is sufficient local ion mobility to secure the dopant into active positions within the silicon matrix to achieve a high degree of activation with essentially no change in concentration profile. The selection of the proper laser annealing parameters is optimized by observation of the reduction of sheet resistance and concentration profile as measured on a test site.

It is yet another object of this invention to describe a method for forming a CMOS device having ultra shallow lightly doped source/drain extensions.

These objects are accomplished by first defining an active silicon region for an n-channel MOSFET and another nearby silicon active region for a p-channel MOSFET, on a silicon wafer. Source/drain regions for each device are then defined in the active silicon regions by forming a gate electrode over a gate oxide for each device. The source/drain regions for both devices are then selectively amorphized by ion implantation followed by implantation of the desired dopant species into these regions. The dopant implantations are alternately implanted in the conventional manner by protecting one device while implanting the other. The dopant in both devices is then simultaneously activated by pulsed laser annealing whereby the pulse fluence, frequency, and duration are chosen to maintain the amorphized region just below it's melting temperature.

DESCRIPTION OF THE PREFERRED EMBODIMENTS

Figure 1:
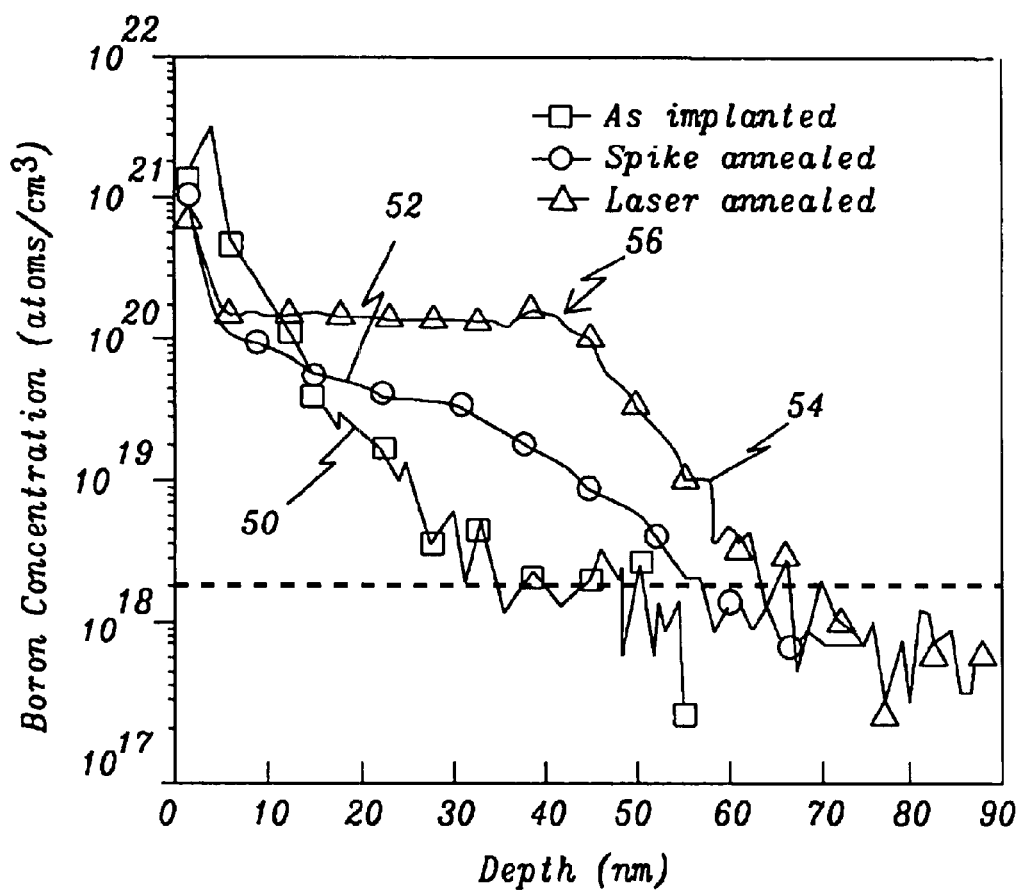
FIG. 1 is a graph showing the behavior of the concentration profile of boron implanted into an pre-amorphized silicon-region as affected by various annealing-treatments.
Figure 2A:
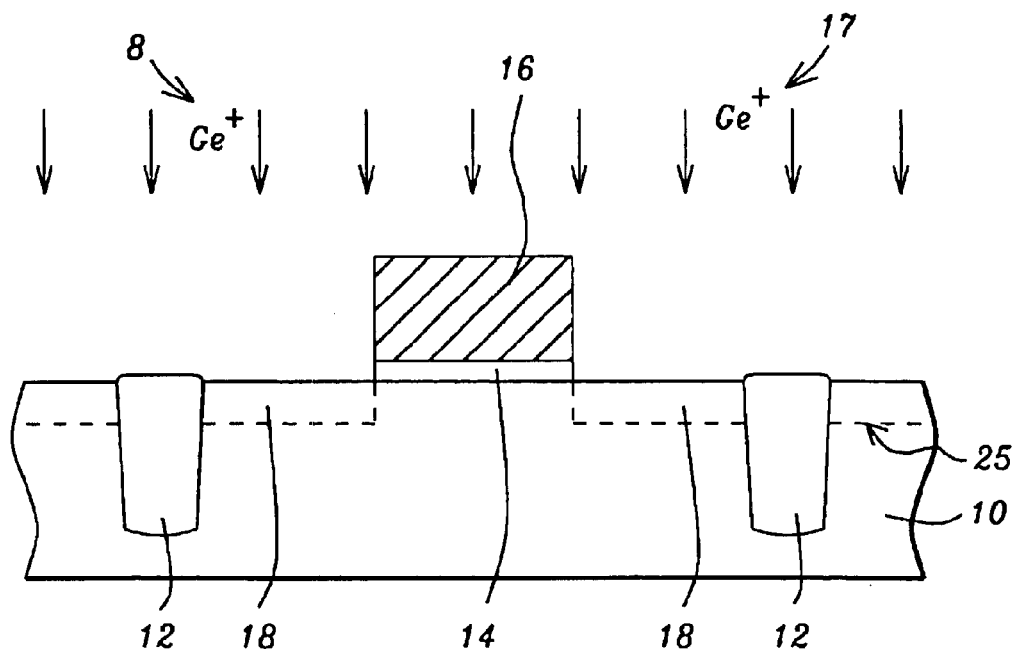
FIGS. 2A thru 2E are cross-sectional views of an in-process wafer which illustrate the process steps of a first embodiment of the present invention.

In a first embodiment of this invention a p-channel self-aligned gate MOSFET is formed with an ultra shallow lightly doped source/drain region on each side of the channel region. Referring to FIG. 2a, an n-type <100> oriented monocrystalline silicon wafer 10 with a resistivity of between about 2 and 50 ohm cm. is provided. Field isolation 12 preferably shallow trench isolation (STI) is formed, defining an enclosed silicon region 8 wherein the device will be formed. The STI regions 12 is formed by the well known method of anisotropically etching a trench surrounding the active silicon device region, growing a between about 100 and 500 Angstrom thick thermal oxide in the trench and then filling the trench by depositing an insulative layer, preferably silicon oxide. The excess silicon oxide above the trench is then removed by CMP (chemical mechanical planarization). Alternately the field isolation 12 may be formed by the familiar LOCOS (local oxidation of silicon) method. A gate oxide 14 is grown on the exposed active silicon and polysilicon is blanket deposited over the gate oxide and patterned to define a polysilicon gate electrode 16.

Figure 2B:
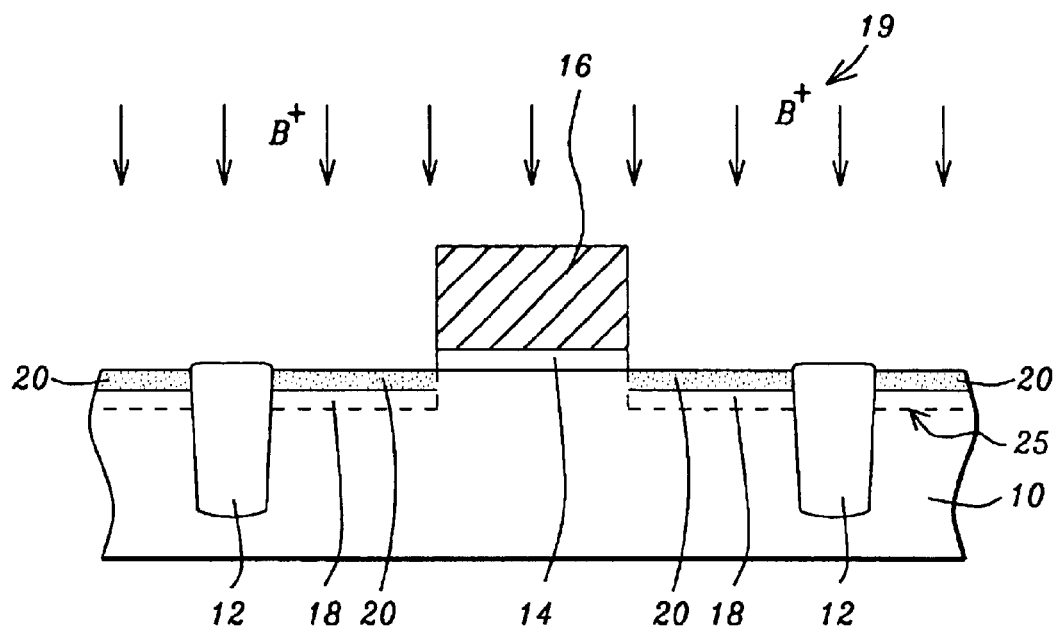

The wafer 10 is next implanted with germanium ions 17 at a dose of between about $1\times10^{14}$ and $1\times10^{16}$ ions/cm$^2$ at an energy of between about 0.5 and 20 keV. This implantation amorphizes the exposed upper surface regions 18 of the active silicon wherein the source and drain elements of the MOSFET are to be formed. Alternately, another ion, for example silicon or argon ions may be implanted to cause the amorphization of these regions. The thickness of the amorphized region, referred to hereafter as the PAI (pre-amorphized implant) layer, is between about 2 and 20 nm. The dashed line 25 indicates the approximate depth of the amorphized regions Referring now to FIG. 2b, boron ions 19 are next implanted into the amorphous silicon regions 18 where they form lightly doped regions 20 having an as-implanted concentration profile indicated by the curve 60 in FIG. 3. The boron ions are implanted at a dose of between about $5\times10^{14}$ and $1\times10^{16}$ ions/cm$^2$ at an energy of between about 0.2 and 0.7 keV. This places the centroid of the boron distribution at a depth of between about 2 and 5 nm. below the silicon surface, well within the amorphous region. Alternately, the boron dose can be incorporated by implanting $BF_2^+$ ions at an implantation energy of between about 5 and 30 keV.

Figure 4:
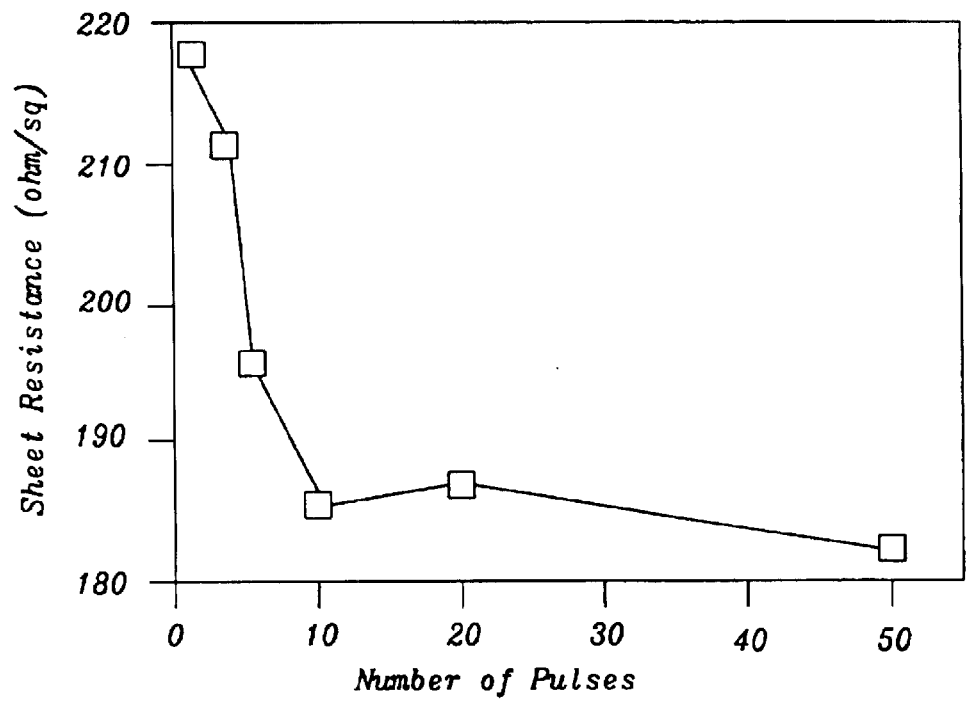
FIG. 4 is a graph showing the behavior of the sheet resistance of a boron implanted pre-amorphized silicon layer as a function of the number of laser pulses applied according to the method of the present invention.

After implantation, the boron atoms must be activated in order to perform as semiconductive acceptor impurity. Activation is accomplished by providing energy to encourage bonding of the boron atoms with the silicon matrix. In the present invention activation is achieved by subjecting the wafer surface to pulsed laser irradiation, preferably using an excimer laser. The laser used in this embodiment is a 248 nm. wavelength KrF excimer laser producing radiation energy at a fluence of between about 0.1 and 0.8 Joules/cm$^2$. Pulses of between about 10 and 40 ns. duration are applied at a repetition rate of about 1 Hz. Multiple pulses are successively applied to the wafer surface, taking care that the laser fluence is kept just low enough to avoid melting of the PAI amorphous silicon layer. Alternately other pulsed lasers may be used having different energies and pulse durations. However, the key consideration is to maintain the laser fluence just below the PAI layer melt regime. During the administration of this laser annealing the boron atoms have sufficient mobility to become activated within the silicon matrix. The activation process is marked by a decrease in sheet resistance of the silicon. FIG. 4 is a graph which shows the behavior of the sheet resistance of a boron implanted PAI layer on a test site which has been subjected to the same processing steps as described supra to form the MOSFET. The graph shows that at least ten pulses are required to effect the major portion of the activation process.

However, application of a total of 50 pulses continues to improve the activation but to a far lesser extent (less than 2% more after the first 10 pulses). Referring back to FIG. 3, the boron profile 62 remains essentially unchanged over the range of 1 to 50 pulses.

Table I summarizes the measured sheet resistance of the boron implanted PAI layer. Not only does the method of the present invention keep the shallow junction in place but also it provides improved activation.

TABLE I

Sheet Resistance of boron implanted amorphized silicon layer

| Sheet Resistance (ohms/square) => | After Anneal |
|---|---|
| Spike Anneal to 1080 C. (RTA) | 300 |
| Laser melted (0.4 J/cm$^2$) | 215 |
| Pulsed Laser (50 pulses, 0.2 J/cm$^2$) | 182 |

Figure 2C:
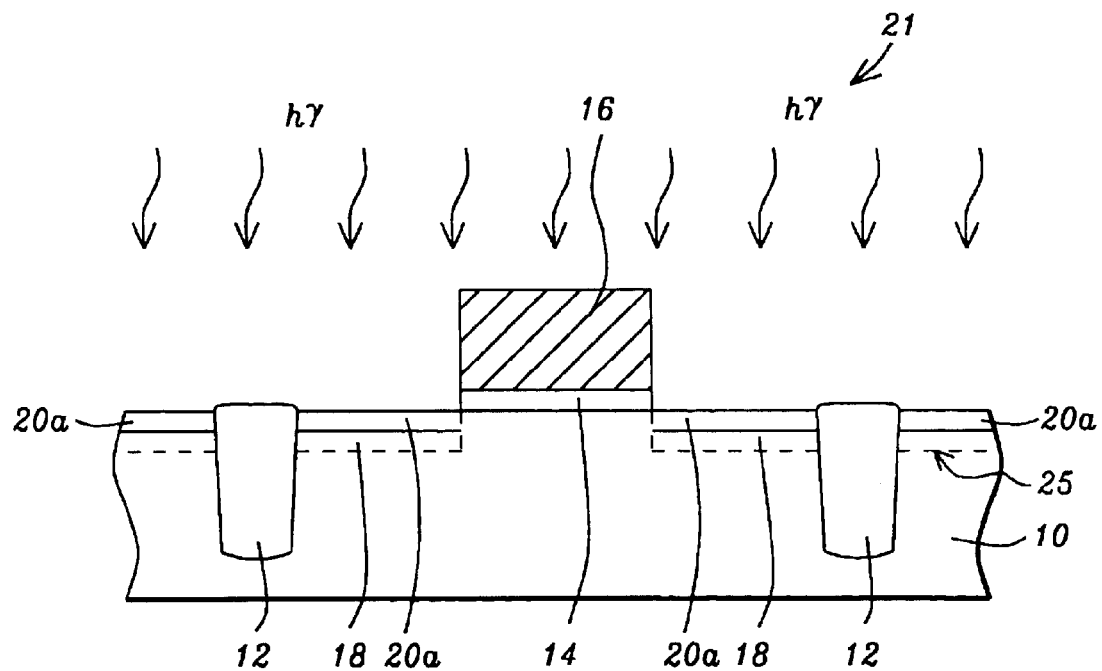

The activation of the shallow boron implantation of the in process MOSFET is illustrated by FIG. 2C where the pulsed laser irradiation h 21 is shown. The shallow source/drain regions 20a are now fully activated. The Laser annealing treatment not only activates the boron by securing improved bonding of the boron atoms into the silicon matrix, but also repairs silicon damage (high stress regions) caused by the germanium implant 17. While the laser treatment does not allow melting of the amorphized region, enough energy is imparted to permit localized bonding rearrangement thereby significantly reducing stress. This is particularly important to reduce junction leakage near the channel region.

Figure 2D:
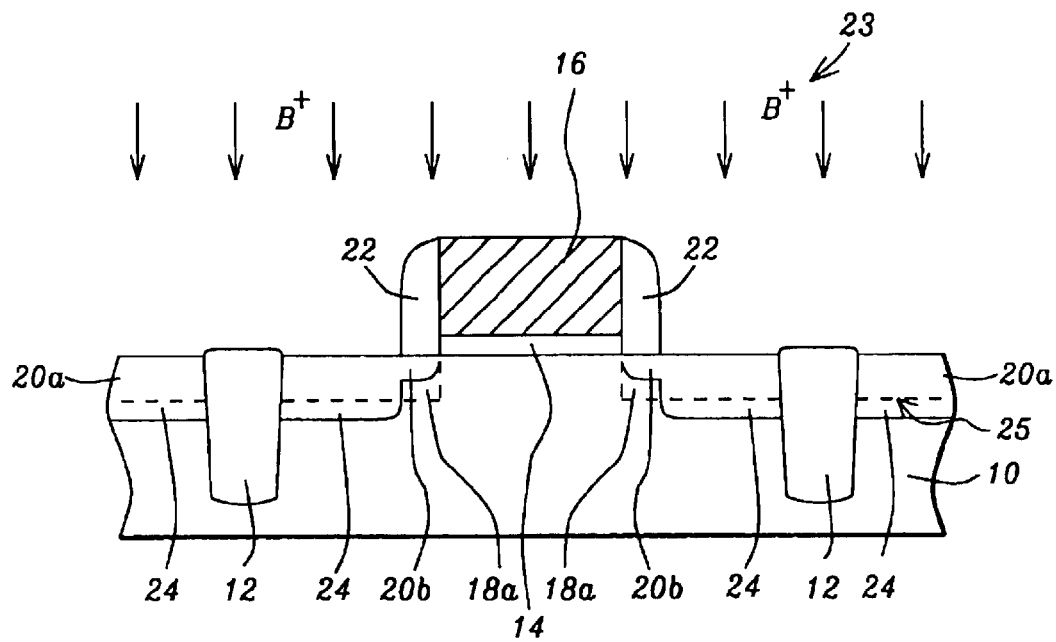

Referring now to FIG. 2D, insulative sidewalls 22 are formed along the polysilicon gate stack 16. Procedures for forming insulative sidewalls are well known in the art. They are formed by first depositing a conformal layer of the selective insulative material, using a CVD method, and then anisotropically etching back the layer with RIE or plasma etching, leaving the sidewalls 22. Preferred insulative materials include silicon oxide, silicon nitride, or silicon oxynitride. The desired or design length of the lightly doped source/drain extensions determines the sidewall thickness which, in turn, determines the thickness of the blanket deposited layer.

After the sidewalls 22 are formed the main source/drain regions are formed by implanting boron into the exposed silicon regions, now masked at the gate electrode, by the sidewalls. The main source/drain elements are considerably deeper and extend below the bottom of the amorphized region, indicated by the dashed line 25. The source/drain extensions 20b lie within the initial amorphized region and therefore, the portions of the p-n junctions which lie under the extensions 20b remains in the PAI region 18a. However, because the laser activation annealing treatment has significantly reduced the local stress in this region, stress induced junction leakage is meliorated.

Figure 2E:
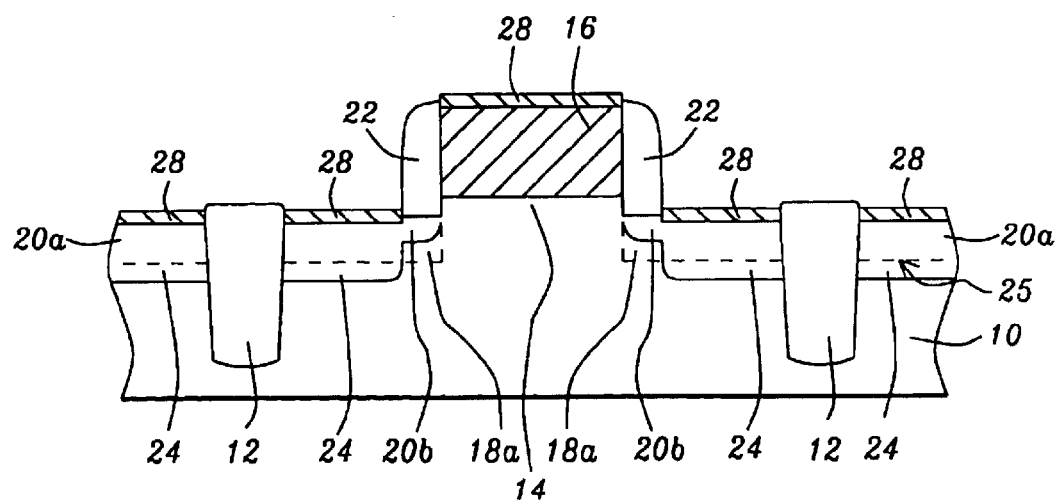

Referring next to FIG. 2E, salicide (self-aligned silicide) contacts 28 are formed on the source/drain regions 24 and on the gate electrode 16, completing the formation of the p-channel MOSFET 30. Methods for forming salicide contacts are well known and widely practiced. The thermal treatment used to form the salicide contacts 28 also provides sufficient activation for the main source/drain regions While the first embodiment of this invention utilizes an n-type silicon substrate with p-type ion implantations, a p-type silicon substrate with n-type ion implantations could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

In a second embodiment of this invention the principles taught in the first embodiment are applied to form a complimentary MOS transistor pair. The main teaching of the second embodiment is that the novel steps of this invention, namely the pre-amorphization and the ultraviolet activation are simultaneously applied to both n—and p-MOS devices, thus, although both—and p-channel devices are formed, the novel steps added by this invention need only be applied once.

Figure 5A:
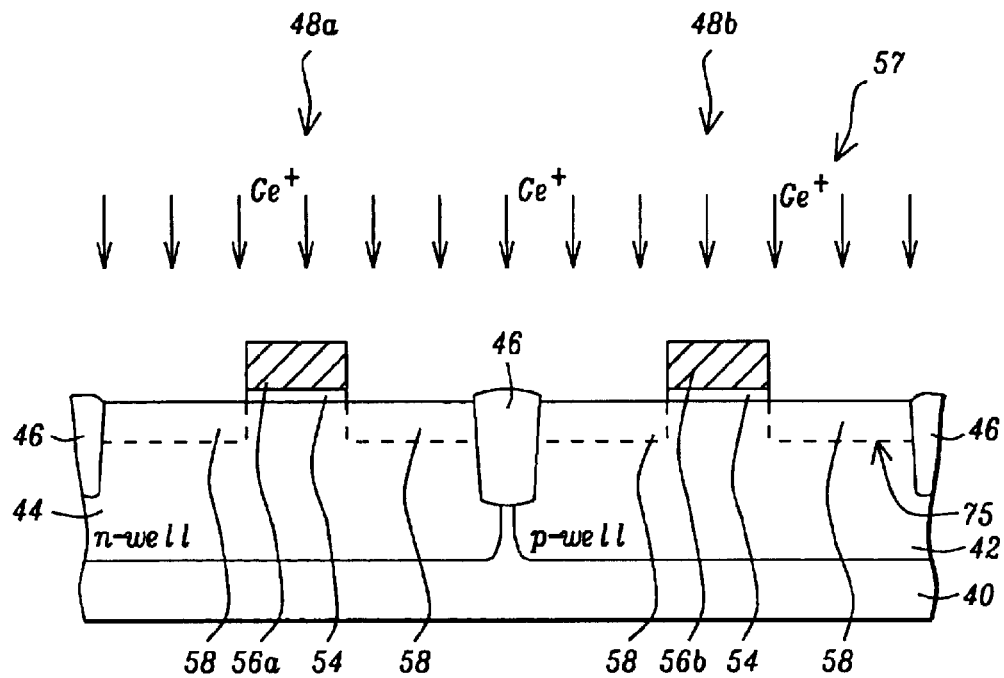
FIGS. 5A thru 5G are cross sectional views of an in-process wafer which illustrate the process steps of a second embodiment of the present invention.

Referring to FIG. 5A, an n-type <100> oriented monocrystalline silicon wafer 40 with a resistivity of between about 2 and 50 ohm cm. is provided. Using well known ion implant procedures, p- and -wells, 42 and 44 respectively, are formed in the wafer surface in regions where the CMOS device pair is to be formed. The n-channel device will be formed in the p-well 42 and the p-channel device in the n-well 44. Field isolation 46 preferably shallow trench isolation (STI) is formed, defining enclosed active silicon regions 48a for the n-MOS device and 48b for the p-MOS device. The STI 46 is formed by a well known method such as that cited in the first embodiment. Alternately the field isolation 46 may be formed by the familiar LOCOS method. A gate oxide 54 is grown on the exposed active silicon regions and polysilicon is blanket deposited over the gate oxide and patterned to define polysilicon gate electrodes 56a and 56b respectively for the n- and p-MOS devices.

Figure 5B:
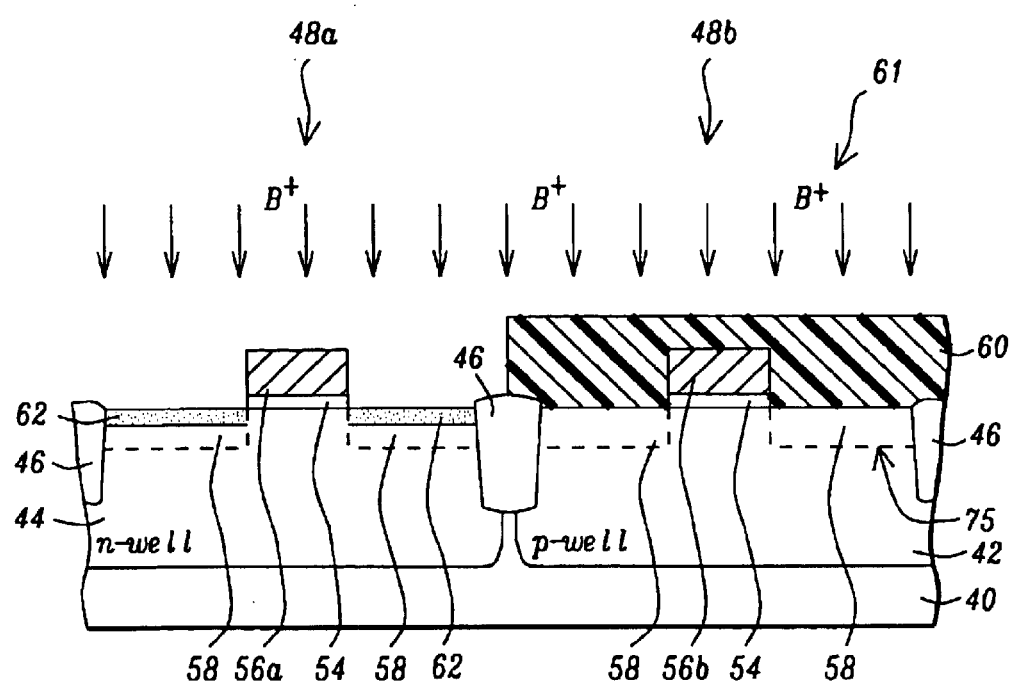
Figure 5C:
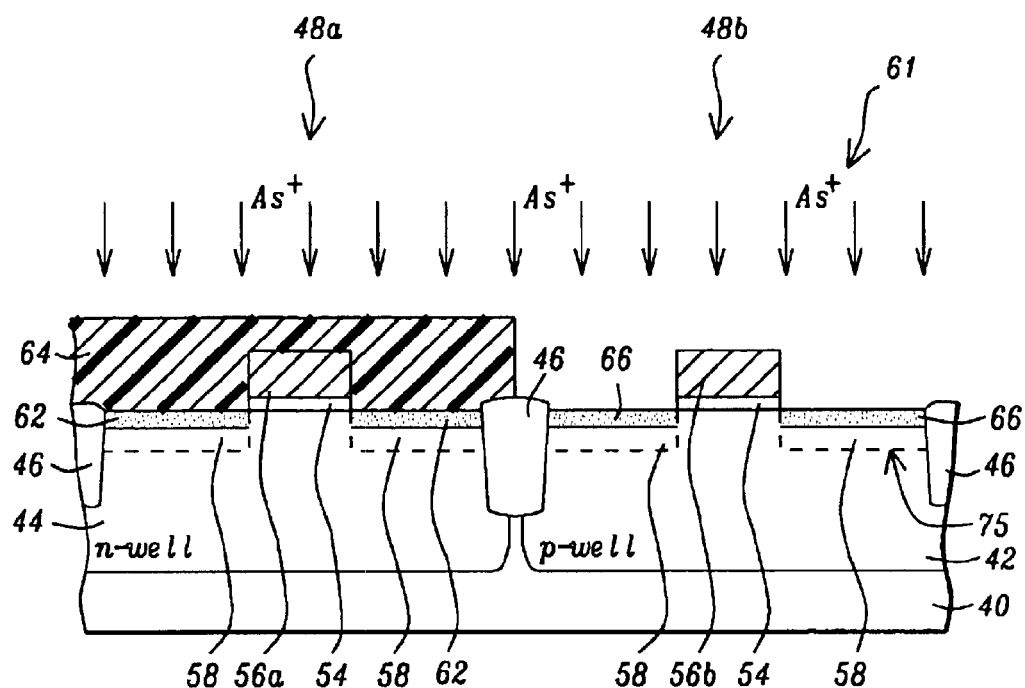

The wafer 40 is next implanted with germanium ions 57 at a dose of between about $1\times10^{14}$ and $1\times10^{16}$ ions/cm$^2$ at an energy of between about 0.5 and 2.0 keV. This implantation amorphizes the exposed upper surface regions 58 of the active silicon wherein the source and drain elements of the MOS devices are to be formed. Alternately, another ion, for example silicon or argon ions may be implanted to cause the amorphization of these regions. The thickness of the amorphized region, referred to hereafter as the PAI (pre-amorphized implant) layer, is between about 2 and 20 nm. The dashed line 75 indicates the approximate depth of the amorphized regions Referring now to FIG. 5B, photoresist is patterned to form a mask 60, protecting the region 48b. Boron ions 61 are next implanted into the amorphous silicon regions 58 exposed in the region 48a where they form lightly doped p-type regions 62 having an as-implanted concentration profile indicated by the curve 60 in FIG. 3. The boron ions are implanted at a dose of between about $5\times10^{14}$ and $1\times10^{16}$ ions/cm$^2$ at an energy of between about 0.2 and 0.7 keV. This places the centroid of the boron distribution at a depth of between about 2 and 5 nm. below the silicon surface, well within the amorphous region. Alternately, the boron dose can be incorporated by implanting $BF_2^+$ ions at an implantation energy of between about 5 and 30 keV. After the shallow boron implantation, the photoresist 60 is stripped, preferably with a chemical stripper, and a second photoresist layer is deposited and patterned to form mask 64 protecting the active region 48a. as illustrated in FIG. 5C.

Figure 3:
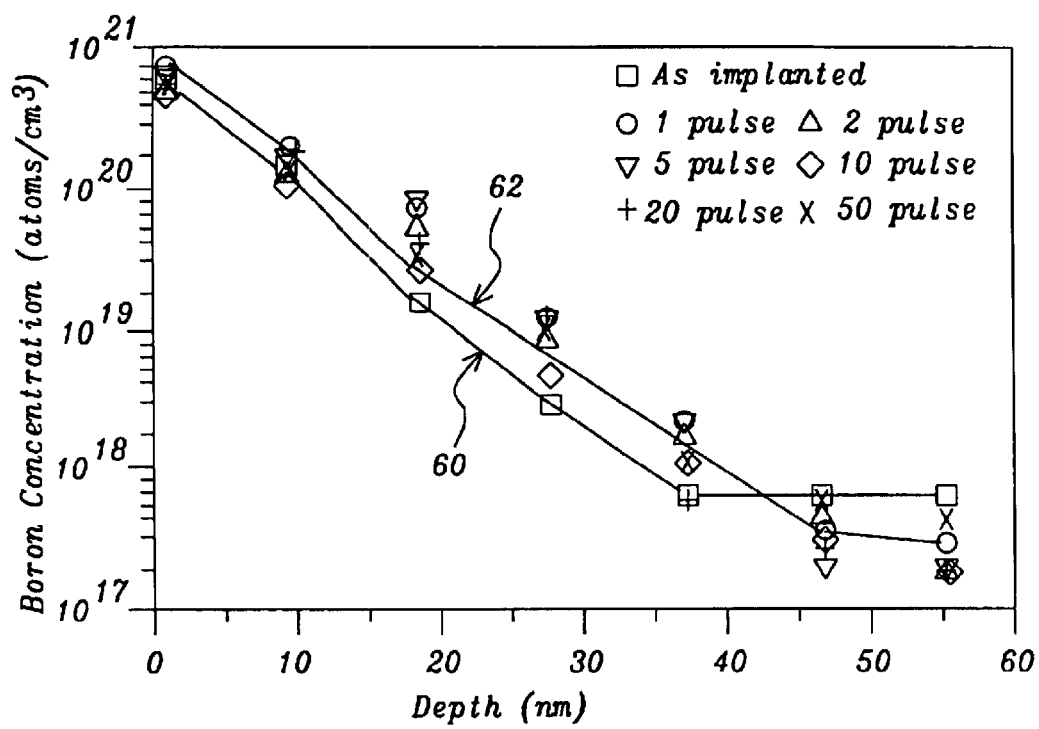
FIG. 3 is a graph showing the behavior of the concentration profile of boron implanted into a pre-amorphized silicon region as affected by various pulsed laser annealing treatments in which the laser fluence is maintained low enough to avoid melting of the pre-amorphized silicon according to the teaching of the present invention.

Arsenic ions 65 are next implanted into the amorphous silicon regions 58 exposed in the region 48b where they form lightly doped n-type regions 66. having an as-implanted concentration profile indicated by the curve 60 in FIG. 3. The Arsenic boron ions are implanted at a dose of between about $5\times10^{14}$ and $1\times10^{16}$ ions/cm$^2$ at an energy of between about 5 and 30 keV. This places the centroid of the arsenic distribution at a depth of between about 3 and 8 nm. below the silicon surface, well within the amorphous region. Alternately, phosphorous ions can be implanted at an implantation energy of between about 2 and 7 keV.

After implantation, the boron and arsenic dopant atoms must be activated in order to perform as semiconductive acceptor and donor sites. Activation is accomplished by providing energy to encourage bonding of the dopant atoms within the silicon matrix. In the present invention activation is achieved by subjecting the wafer surface to pulsed laser irradiation, preferably using an excimer laser. The laser used in this embodiment is a 248 nm. wavelength KrF excimer laser producing radiation energy at a fluence of between about 0.1 and 0.8 Joules/cm$^2$. Pulses of between about 10 and 40 ns. duration are applied at a repetition rate of about 1 Hz. Multiple pulses are successively applied to the wafer surface, taking care that the laser fluence is kept just low enough to avoid melting of the PAI amorphous silicon layer. The number of pulses may be determined experimentally and depends upon the dopants used. Alternately other pulsed lasers may be used having different energies and pulse durations. However, the key consideration is to maintain the laser fluence just below the PAI layer melt regime. During the administration of this laser annealing treatment the dopant atoms have sufficient mobility to become activated within the silicon matrix. The activation process is marked by a decrease in sheet resistance of the silicon.

Figure 5D:
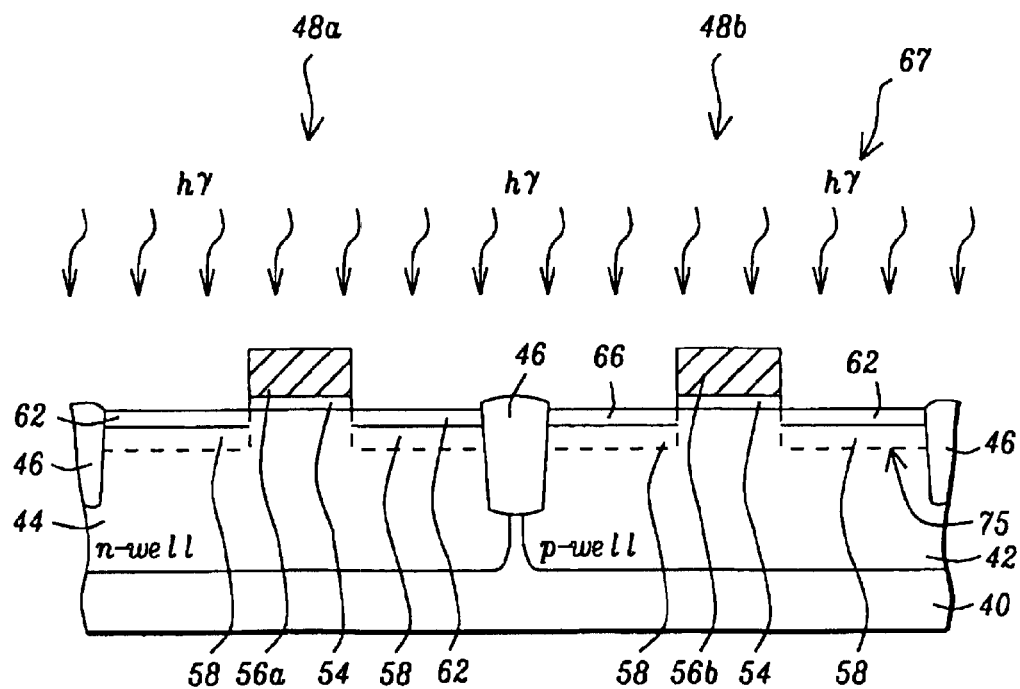

The activation of the shallow dopant implantation of the in process CMOS transistor pair is illustrated by FIG. 5D where the pulsed laser irradiation h 67 is shown. The shallow source/drain regions 62 and 66 are now fully activated. The Laser annealing treatment not only activates the dopant atoms by securing improved bonding of the boron atoms into the silicon matrix, but also repairs silicon damage (high stress regions) caused by the germanium implant 73. While the laser treatment does not allow melting of the amorphized region, enough energy is imparted to permit localized bonding rearrangement thereby significantly reducing stress. This is particularly important to reduce junction leakage near the channel region.

Figure 5E:
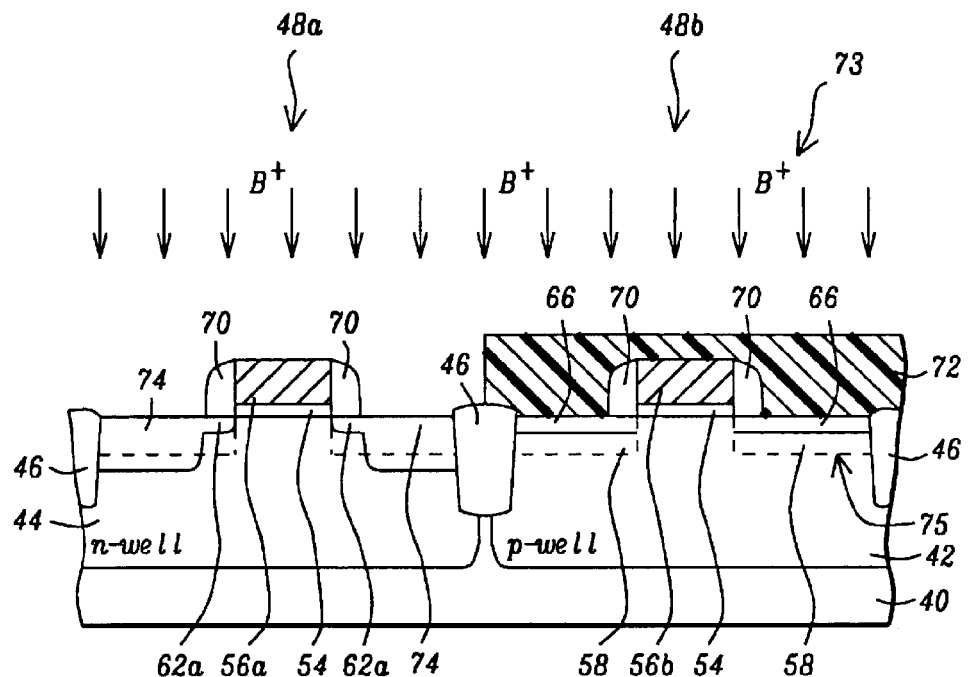

Referring now to FIG. 5E, insulative sidewalls 70 are formed along the polysilicon gate 56a and 56b. Procedures for forming insulative sidewalls are well known in the art. They are formed by first depositing a conformal layer of the selective insulative material, using a CVD method, and then anisotropically etching back the layer with RIE or plasma etching, leaving the sidewalls 70. Preferred insulative materials include silicon oxide, silicon nitride, or silicon oxynitride. The desired or design length of the lightly doped source/drain extensions determines the sidewall thickness which, in turn, determines the thickness of the blanket deposited layer.

Figure 5F:
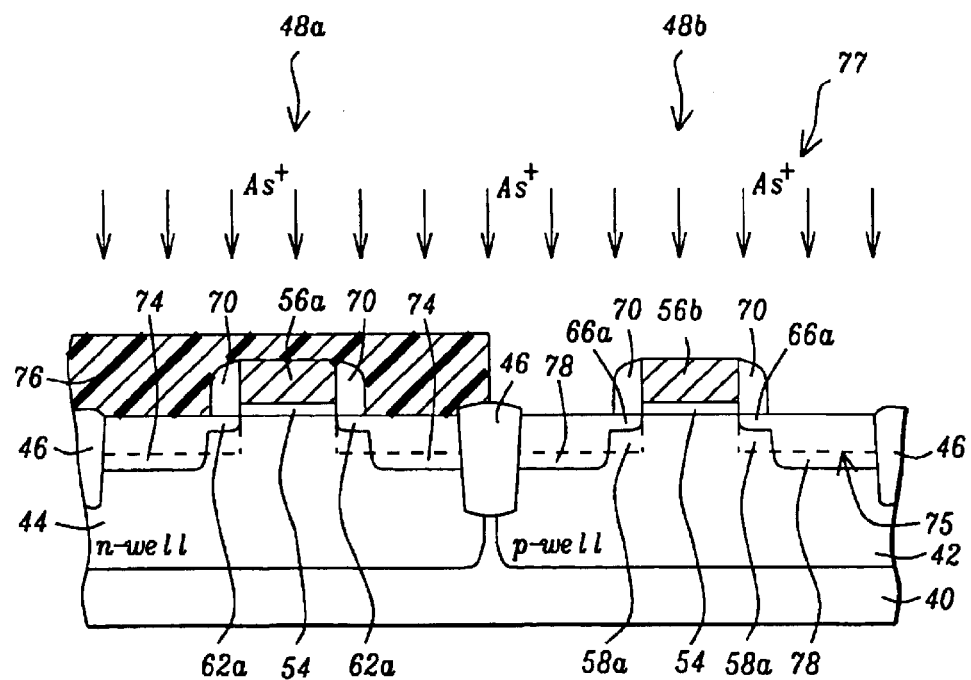

After the sidewalls 70 are formed the main source/drain regions are formed by implanting boron and arsenic into the respective exposed silicon regions 48a and 48b respectively. The procedures for implanting the main source/drain regions are similar to those previously applied to form the lightly doped extensions 62a and 66a. As shown in FIG. 5E the n-channel device region 48b is protected by photoresist pattern 72 while the p-type main source/drain regions 74 are implanted into the p-channel device 48a. Then, as illustrated by FIG. 5F, photoresist mask 72 is stripped and photoresist mask 76 is patterned to protect the p-channel region. The n-channel device main source/drain regions are then implanted 77 with arsenic or alternately, phosphorous.

The main source/drain elements are considerably deeper and extend below the bottom of the amorphized region, indicated by the dashed line 75. The source/drain extensions 62a and 66a lie within the initial amorphized regions 58a and therefore, the portions of the p-n junctions which lie under those extensions remain in the PAI region 58a. However, because the laser activation annealing treatment has significantly reduced the local stress in these regions, stress induced junction leakage is meliorated.

Figure 5G:
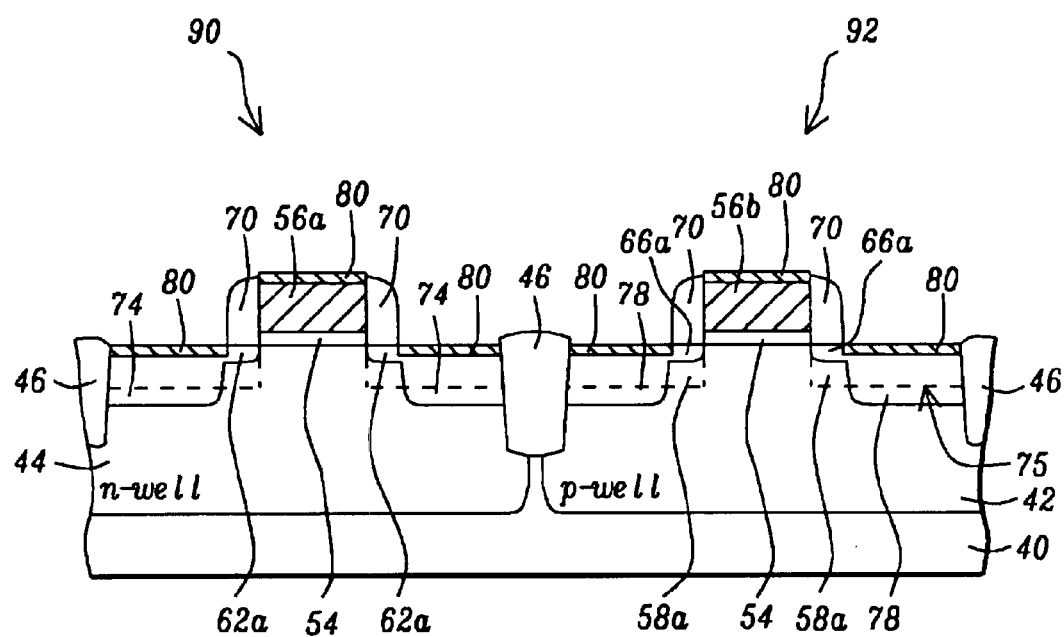

Referring next to FIG. 5G, salicide (self-aligned silicide) contacts 80 are formed on the main source/drain regions 74 and 78 and on the gate electrodes 56a and 56b, completing the formation of a p-channel MOSFET 90 and an n-channel MOSFET 92, together forming a CMOS pair. Methods for forming salicide contacts are well known and widely practiced. The thermal treatment used to form the salicide contacts also provides sufficient activation for the main source/drain regions of each device.

While the first embodiment of this invention utilizes an n-type silicon substrate with p-type ion implantations, a p-type silicon substrate with n-type ion implantations could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

While this invention has been particularly shown and described with reference to the preferred embodiments thereof, it will be understood by those skilled in the art that various changes in form and details may be made without departing from the spirit and scope of the invention.

What is claimed is:

1. A method for forming for forming highly activated, ultra shallow semiconductive element of a first conductive type embedded in a semiconductive region of a second conductive type comprising:

I. providing a semiconductor substrate having an active region of said second conductive type;

(b) amorphizing an upper portion of said active region by ion implantation;

(c) implanting an impurity of said first type into said upper portion; and (d) activating said impurity, thereby forming said semiconductive element of said second type, by pulsed laser irradiation whereby the fluence, pulse duration, and pulse frequency of said irradiation is selected to raise the local temperature of said upper portion to just below but never reaching or exceeding the melting temperature of said amorphized upper region.

2. The method of claim 1 wherein said semiconductor substrate is silicon.

3. The method of claim 2 wherein said first conductive type is p-type and said second conductive type is n-type.

4. The method of claim 1 wherein said amorphizing is performed by ion implantation of germanium or silicon ions.

5. The method of claim 4 wherein said amorphizing is performed by implanting germanium or silicon ions at a dose of between about $1 \times 10^{14}$ and $1 \times 10^{16}$ ions/cm$^2$ at an energy of between about 0.5 and 20 keV.

6. The method of claim 1 wherein said upper portion is between about 2 and 20 nm, thick.

7. The method of claim 3 wherein said impurity of said first type is boron implanted as boron ions at a dose of between about $5 \times 10^{14}$ and $1 \times 10^{18}$ ions/cm$^2$ at an energy of between about 0.2 and 0.7 keV.

8. The method of claim 3 wherein said impurity of said first type is boron implanted as BF$_2^+$ions at a dose of between about 5×10 and 1×10$^{16}$ ions/cm$^2$ at an energy of between about 5 and 30 keV.

9. The method of claim 1 wherein said pulsed laser irradiation is performed by a 248 nm. wavelength KrF excimer laser producing radiation energy at a fluence of between about 0.1 and 0.8 Joules/cm$^2$ in pulses of between about 10 and 40 ns. duration, applied at a repetition rate of about 1 Hz.

10. The method of claim 9 wherein at least 10 pulses are applied.

11. The method of claim 2 wherein said first conductive type is n-type and said second conductive type is p-type.

12. The method of claim 11 wherein said impurity of said first type is phosphorous implanted at a dose of between about 5×10$^{14}$ and 1×10$^{16}$ ions/cm$^2$ at an energy of between about 2 and 10 keV.

13. The method of claim 11 wherein said impurity of said first type is arsenic implanted at a dose of between about 5×10$^{14}$ and 1×10$^{16}$ ions/cm$^2$ at an energy of between about 5 and 30 keV.

14. A method for forming a MOSFET device having ultra shallow lightly doped source/drain extensions, comprising:
1. providing a semiconductor substrate having an active region of a first conductive type enclosed by field isolation;
(b) forming a gate oxide on said active region;
(c) forming a gate electrode on said gate oxide, thereby defining source/drain regions separated by a gate stack;
(d) amorphizing an upper portion of said source/drain regions by ion implantation;
(e) implanting a first dose of an impurity of a second type into said upper portion;
(f) forming source/drain extensions by activating said impurity of said second type by pulsed laser irradiation whereby the fluence, pulse duration, and pulse frequency of said irradiation is selected to raise the local temperature of said upper portion to just below but never reaching or exceeding the melting temperature of said amorphized upper region;
(g) forming sidewalls alongside said gate stack; and
(h) implanting a second dose of an impurity of said second type thereby forming source/drain contact elements.

15. The method of claim 14 wherein said semiconductor substrate is silicon.

16. The method of claim 14 wherein said amorphizing is performed by ion implantation of germanium or silicon ions.

17. The method of claim 16 wherein said amorphizing is performed by implanting germanium or silicon ions at a dose of between about 1×10$^{14}$ and 1×10$^{16}$ ions/cm$^2$ at an energy of between about 0.5 and 20 keV.

18. The method of claim 14 wherein said upper portion is between about 2 and 20 nm, thick.

19. The method of claim 15 wherein said first conductive type is n-type and said second conductive type is p-type.

20. The method of claim 15 wherein said impurity of said second type is boron implanted as boron ions at a dose of between about 5×10$^{14}$ and 1×10$^{16}$ ions/cm$^2$ at an energy of between about 0.2 and 0.7 keV.

21. The method of claim 15 wherein said impurity of said second type is boron implanted as BF$_2^+$ions at a dose of between about 5×10$^{14}$ and 1×10$^{16}$ ions/cm$^2$ at an energy of between about 5 and 30 keV.

22. The method of claim 14 wherein said pulsed laser irradiation is performed by a 248 nm. wavelength KrF excimer laser producing radiation energy at a fluence of between about 0.1 and 0.8 Joules/cm$^2$ in pulses of between about 10 and 40 ns. duration, applied at a repetition rate of about 1 Hz.

23. The method of claim 22 wherein at least 10 pulses are applied.

24. The method of claim 15 wherein said first conductive type is p-type and said second conductive type is n-type.

25. The method of claim 24 wherein said impurity of said second type is phosphorous implanted at a dose of between about 5×10$^{14}$ and 1×10$^{16}$ ions/cm$^2$ at an energy of between about 2 and 10 keV.

26. The method of claim 24 wherein said impurity of said second type is arsenic implanted at a dose of between about 5×10$^{14}$ and 1×10$^{16}$ ions/cm$^2$ at an energy of between about 5 and 30 keV.

27. The method of claim 14 wherein said gate electrode is formed of polysilicon.

28. The method of claim 14 wherein said source/drain elements extend below said amorphized region.

29. A method for forming a CMOS device having ultra shallow lightly doped source/drain extensions, comprising:
9. providing a semiconductor substrate having an n-type active region and a p-type active region, each of said active regions enclosed by field isolation;
(j) forming a gate oxide on each of said active regions;
(k) forming a first gate electrode on said gate oxide on said n-type active region and a second gate electrode on said gate oxide on said p-type active region, thereby defining first source/drain regions separated by a first gate stack on said n-type active region and second source drain regions separated by a second gate stack on said p-type active region;
(l) amorphizing an upper portion of each of said source/drain regions by ion implantation;
(m) patterning a first layer of photoresist on said wafer to form a first blockout mask protecting said second source/drain regions;
(n) implanting a first dose of a p-type impurity into said upper portion of said first source/drain regions;
(o) striping said first blockout mask;
(p) patterning a second layer of photoresist on said wafer to form a second blockout mask protecting said first source/drain regions;
(q) implanting a first dose of an n-type impurity into said upper portion of said second source/drain regions;
(r) striping said second blockout mask;
(s) forming sidewalls alongside each of said first and second gate stacks;
(t) patterning a third layer of photoresist on said wafer to form a third blockout mask protecting said second source/drain regions;
(u) implanting a second dose of a p-type impurity into said upper portion of said first source/drain regions;
(v) striping said third blockout mask;
(w) patterning a fourth layer of photoresist on said wafer to form a fourth blockout mask protecting said first source/drain regions;
(x) implanting a second dose of an n-type impurity into said upper portion of said second source/drain regions;
(y) striping said fourth blockout mask;
(z) forming source/drain contact elements with extensions by activating said first and second doses of said p-type impurity and said first and second doses of said n-type impurity by pulsed laser irradiation whereby the fluence, pulse duration, and pulse frequency of said irradiation is selected to raise the local temperature of said upper portion to just below but never reaching or exceeding the melting temperature of said amorphized upper region; and (aa) forming silicide contact on each of said source/drain contact elements and on each of said gate stacks.

30. The method of claim 29 wherein said semiconductor substrate is silicon.

31. The method of claim 29 wherein said amorphizing is performed by ion implantation of germanium or silicon ions.

32. The method of claim 29 wherein said amorphizing is performed by implanting germanium or silicon ions at a dose of between about $1 \times 10^{14}$ and $1 \times 10^{16}$ ions/Cm$^2$ at an energy of between about 0.5 and 20 keV.

33. The method of claim 29 wherein said upper portion is between about 2 and 20 nm, thick.

34. The method of claim 29 wherein said first dose of said p-type impurity is boron implanted as boron ions at a dose of between about $5 \times 10^{14}$ and $1 \times 10^{16}$ ions/cm$^2$ at an energy of between about 0.2 and 0.7 keV.

35. The method of claim 29 wherein said first dose of said p-type impurity is boron implanted as $BF_2^+$ ions at a dose of between about $5 \times 10^{14}$ and $1 \times 10^{16}$ ions/Cm$^2$ at an energy of between about 5 and 30 keV.

36. The method of claim 29 wherein said first dose of said n-type impurity is phosphorous implanted at a dose of between about $5 \times 10^{14}$ and $1 \times 10^{16}$ ions/cm$^2$ at an energy of between about 2 and 10 keV.

37. The method of claim 29 wherein said first dose of said n-type impurity is arsenic implanted at a dose of between about $5 \times 10^{14}$ and $1 \times 10^{16}$ ions/cm$^2$ at an energy of between about 5 and 30 keV.

38. The method of claim 29 wherein said source/drain contact elements extend below said amorphized region.

* * * * *

UNITED STATES PATENT AND TRADEMARK OFFICE
CERTIFICATE OF CORRECTION

PATENT NO. : 6,897,118 B1
DATED : May 24, 2005
INVENTOR(S) : Chyiu-Hyia Poon et al.

It is certified that error appears in the above-identified patent and that said Letters Patent is hereby corrected as shown below:

Column 8,
Line 32, delete "for forming".
Line 36, delete "I" and replace with -- (a) --.
Line 64, delete "$1 \times 10^{18}$" and replace with -- $1 \times 10^{16}$ --.

Column 9,
Line 1, delete "5x10" and replace with -- $5 \times 10^{14}$ --.
Line 22, delete "1." and replace with -- (a) --.

Column 10, line 19 - Column 11, line 3,
Delete "9" through "(aa)" and replace with -- a -- through -- s --.

Signed and Sealed this

Twenty-second Day of November, 2005

JON W. DUDAS
*Director of the United States Patent and Trademark Office*